(12) United States Patent
Drab et al.

(10) Patent No.: US 10,784,234 B2
(45) Date of Patent: Sep. 22, 2020

(54) DIE ENCAPSULATION IN OXIDE BONDED WAFER STACK

(71) Applicant: Raytheon Company, Waltham, MA (US)

(72) Inventors: John J. Drab, Waltham, MA (US); Jason G. Milne, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/363,356

(22) Filed: Mar. 25, 2019

(65) Prior Publication Data

US 2019/0221547 A1 Jul. 18, 2019

Related U.S. Application Data

(62) Division of application No. 15/596,663, filed on May 16, 2017, now Pat. No. 10,242,967.

(51) Int. Cl.
*H01L 25/065* (2006.01)
*H01L 23/31* (2006.01)
(Continued)

(52) U.S. Cl.
CPC .......... *H01L 25/0657* (2013.01); *H01L 21/50* (2013.01); *H01L 21/54* (2013.01);
(Continued)

(58) Field of Classification Search
CPC . H01L 25/0657; H01L 25/50; H01L 25/0652; H01L 2225/06541;
(Continued)

(56) References Cited

U.S. PATENT DOCUMENTS 7,138,293 B2 * 11/2006 Ouellet ............... B81C 1/00269
438/106
2005/0167795 A1 8/2005 Higashi
(Continued)

FOREIGN PATENT DOCUMENTS

EP 3104410 A1 12/2016
WO 03/034490 A2 4/2003

OTHER PUBLICATIONS

Drab, "Multilevel Wafer Stacking for 3D Circuit Integration," Raytheon Technology Today, No. 1, 2015, pp. 30-31.
(Continued)

*Primary Examiner* — Jasmine J Clark
(74) *Attorney, Agent, or Firm* — Burns & Levinson, LLP; Joseph M. Maraia (57) ABSTRACT

Structures and methods of fabricating semiconductor wafer assemblies that encapsulate one or die in a cavity etched into an oxide bonded semiconductor wafer stack. The methods generally include the steps of positioning the die in the cavity, mechanically and electrically mounting the die to the wafer stack, and encapsulating the die within the cavity by bonding a lid wafer to the wafer stack in one of multiple ways. Semiconductor processing steps are applied to construct the assemblies (e.g., deposition, annealing, chemical and mechanical polishing, etching, etc.) and connecting the die (e.g., bump bonding, wire interconnecting, ultrasonic bonding, oxide bonding, etc.) according to the embodiments described above.

9 Claims, 5 Drawing Sheets

(51) Int. Cl.
*H01L 21/56* (2006.01)
*H01L 21/78* (2006.01)
*H01L 23/10* (2006.01)
*H01L 21/50* (2006.01)
*H01L 21/54* (2006.01)
*H01L 23/00* (2006.01)
*H01L 25/00* (2006.01)

(52) U.S. Cl.
CPC ............ H01L 21/561 (2013.01); H01L 21/78 (2013.01); H01L 23/10 (2013.01); H01L 23/3178 (2013.01); H01L 24/81 (2013.01); H01L 24/92 (2013.01); H01L 24/94 (2013.01); H01L 25/0652 (2013.01); H01L 25/50 (2013.01); *H01L 24/03* (2013.01); *H01L 24/05* (2013.01); *H01L 24/08* (2013.01); *H01L 24/13* (2013.01); *H01L 24/16* (2013.01); *H01L 24/17* (2013.01); *H01L 24/27* (2013.01); *H01L 24/29* (2013.01); *H01L 24/32* (2013.01); *H01L 24/80* (2013.01); *H01L 24/83* (2013.01); *H01L 2224/0381* (2013.01); *H01L 2224/0384* (2013.01); *H01L 2224/04* (2013.01); *H01L 2224/0401* (2013.01); *H01L 2224/05155* (2013.01); *H01L 2224/05644* (2013.01); *H01L 2224/05687* (2013.01); *H01L 2224/08146* (2013.01); *H01L 2224/131* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16146* (2013.01); *H01L 2224/1703* (2013.01); *H01L 2224/17181* (2013.01); *H01L 2224/2781* (2013.01); *H01L 2224/2784* (2013.01); *H01L 2224/291* (2013.01); *H01L 2224/32145* (2013.01); *H01L 2224/80205* (2013.01); *H01L 2224/80487* (2013.01); *H01L 2224/80896* (2013.01); *H01L 2224/81825* (2013.01); *H01L 2224/83203* (2013.01); *H01L 2224/83896* (2013.01); *H01L 2224/9222* (2013.01); *H01L 2224/92222* (2013.01); *H01L 2224/92225* (2013.01); *H01L 2224/94* (2013.01); *H01L 2225/06506* (2013.01); *H01L 2225/06513* (2013.01); *H01L 2225/06541* (2013.01); *H01L 2225/06548* (2013.01); *H01L 2225/06555* (2013.01); *H01L 2225/06572* (2013.01); *H01L 2225/06586* (2013.01); *H01L 2225/06589* (2013.01); *H01L 2924/10155* (2013.01); *H01L 2924/15151* (2013.01); *H01L 2924/15153* (2013.01); *H01L 2924/163* (2013.01)

(58) Field of Classification Search
CPC . H01L 2225/06513; H01L 2225/06589; H01L 2225/06555; H01L 2225/06586; H01L 2225/06548; H01L 2225/06572; H01L 2225/06506; H01L 21/54; H01L 21/50; H01L 21/561; H01L 21/78; H01L 24/83; H01L 24/29; H01L 24/27; H01L 24/17; H01L 24/16; H01L 24/13; H01L 2224/83896; H01L 24/08; H01L 24/80; H01L 24/32; H01L 24/05; H01L 2224/9222; H01L 24/03; H01L 24/81; H01L 24/92; H01L 24/94; H01L 2224/92225; H01L 2224/04; H01L 2224/92222; H01L 2224/0381; H01L 2224/0384; H01L 2224/0401; H01L 2224/05155; H01L 2224/05644; H01L 2924/163; H01L 2224/05687; H01L 2224/08146; H01L 2224/131; H01L 2224/13109; H01L 2224/13111; H01L 2224/13139; H01L 2224/13144; H01L 2224/13147; H01L 2224/13155; H01L 2224/16146; H01L 2224/81825; H01L 2224/80487; H01L 2224/2781; H01L 2224/1703; H01L 2224/17181; H01L 2224/2784; H01L 2224/291; H01L 2224/32145; H01L 2224/80896; H01L 2224/83203; H01L 2924/10155; H01L 2924/15151; H01L 2924/15153; H01L 2224/48145; H01L 2924/1461; H01L 23/13; H01L 23/5389; H01L 2224/80205
See application file for complete search history.

(56) References Cited

U.S. PATENT DOCUMENTS

2006/0216857 A1    9/2006    Zhao
2008/0157330 A1    7/2008    Kroehnert et al.
2016/0280538 A1*   9/2016    Rothberg ............ B81C 1/00238

OTHER PUBLICATIONS

International Preliminary Report on Patentability from related PCT Application No. PCT/US2017/061922, dated Nov. 28, 2019.

* cited by examiner

DIE ENCAPSULATION IN OXIDE BONDED WAFER STACK

CROSS-REFERENCE TO RELATED APPLICATION

This application is a divisional of U.S. patent application Ser. No. 15/596,663 filed on May 16, 2017, now U.S. Pat. No. 10,242,967 issued on Mar. 26, 2019, which is incorporated herein by reference.

BACKGROUND

The present disclosure relates to fabrication of integrated circuits, semiconductor devices and other miniaturized devices, and more particularly, to fabrication of three-dimensional integrated circuits (3D-ICs) including semiconductor dies encapsulated in an oxide bonded wafer stack.

As semiconductor device sizes have decreased, 3D device integration has become a desired method for increasing the density of integrated circuits and/or semiconductor devices, offering much smaller form factor along with higher performance and lower power compared to 2D designs. 3D-IC assemblies are comprised of two or more stacked layers of active electronic components (e.g., sensors and readout circuits) using horizontal intra-tier and vertical (through-silicon vias, TSVs) inter-tier connectivity so that they behave as a single device. Package-to-package stacking and die-to-die (D2D) stacking allow selection of "known good dies" for stacking and can provide higher yield but limited performance improvement compared to 3D. 2D approaches sometimes use wire bonds that require a long connection which slows the speed and limits the number of possible connections. More elegant 2.5D solutions use bump bonds to an interposer that provides routing between circuits, but still result in higher power and lower performance than true 3D circuits. Also, due to the ultra-thin nature of the die, D2D stacks are difficult to handle and susceptible to breakage and contamination. Wafer-to-wafer (W2W) 3D stacking allows TSVs to be scaled down to smaller diameters with thinner wafers permitting higher 3D connection densities leading to higher bandwidth, performance, and power improvements and offering lower manufacturing costs. However, 3D stacking can suffer from reduced yields since, if any one of N chips in a 3D-IC is defective, the entire 3D-IC will be defective. In addition, the wafer stacking is optimal with wafers of the same size, and since non-silicon materials (e.g., III-V's) are typically manufactured on smaller wafers than silicon CMOS logic or DRAM, wafer level heterogeneous integration can pose manufacturing and yield challenges.

3D integration using oxide bonding has been primarily used to bond full wafers as the processing is not as mature for bonding at the die level. Solder-seal wafer level packaging has been demonstrated, as has bonding of wafers with cavities. Known techniques are available for direct metal to metal bonding of an integrated circuit die onto a silicon wafer, but the techniques have limitations for high layer count wafer stacking die to process stress, yield, interconnect density and thermal limitations. Other techniques have integrated multiple die onto an interposer, but have neither extended the stacking further in the z-axis to more than 2-3 layers, nor achieved heterogeneous or hermetically sealed devices.

The present disclosure contemplates a new and improved method for fabrication of 3D-ICs using die encapsulation that overcomes current limitations. Some embodiments also address the needed for on-chip thermal management permitting higher power dissipation and greater packaging densities.

SUMMARY

This disclosure is directed to oxide bonded semiconductor wafer assemblies encapsulating one or more device die, and processes for forming them. In one embodiment, the wafer assembly includes a first wafer having a first surface that includes an oxide layer, a second wafer having a first surface and a second surface, the first surface including an oxide layer that is bonded to the oxide layer of the first wafer, and wherein the first and second wafers define a cavity. A semiconductor die is mechanically and electrically connected to the first wafer in the cavity, and a third wafer having a first surface that is bonded to the second surface of the second wafer encapsulates the die. The die may be connected by a bump bond, a wire interconnection, an ultrasonic bond, and/or an oxide bond. The encapsulation may comprise a hermetic seal. Each of the wafers may include an integrated circuit (IC) and one or more through silicon vias (TSVs) for electrically connecting the ICs among the wafers and the die, and to external devices and wafers.

In another embodiment, a thermal interface may be formed between the semiconductor die and one or more of the wafers.

In another embodiment, the second (middle) wafer and the third (lid) wafer are bump bonded so as to define an air gap providing thermal isolation from the cavity.

In another embodiment, the second surface of the second (middle) wafer and the first surface of the third (lid) wafer each include an oxide layer. The second and third wafers may be oxide bonded together at their respective oxide layers.

In another embodiment, one or more of the first, second and third wafers may have a conduit to the cavity from the exterior of the wafer assembly. The conduit and the cavity may be at least partially filled with a thermally conductive or other functional material. The conduit and cavity may be evacuated and sealed providing a vacuum package to enhance thermal isolation. The conduit and cavity may be evacuated and backfilled with a liquid or gas before the cavity is sealed.

In another aspect, methods of fabricating semiconductor wafer assemblies that encapsulate one or die in a cavity etched into an oxide bonded semiconductor wafer stack. The methods generally include the steps of positioning the die in the cavity, mechanically and electrically mounting the die to the wafer stack, and encapsulating the die within the cavity by bonding a lid wafer to the wafer stack in one of multiple ways. Semiconductor processing steps are applied to construct the assemblies (e.g., photolithography, deposition, annealing, chemical and mechanical polishing, etching, etc.) and connecting the die (e.g., bump bonding, wire interconnecting, ultrasonic bonding, oxide bonding, etc.) according to the embodiments described above.

Other objects and advantages of the disclosed embodiments will be better appreciated from the following detailed description.

BRIEF DESCRIPTION OF THE FIGURES

Various aspects of at least one embodiment of the present disclosure are discussed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Where considered appropriate, reference numerals may be repeated among the drawings to indicate corresponding or analogous elements. For purposes of clarity, not every component may be labeled in every drawing. The figures are provided for the purposes of illustration and explanation and are not intended as a definition of the limits of the invention. In the figures.

DETAILED DESCRIPTION

In the following detailed description, numerous specific details are set forth in order to provide a thorough understanding of the aspects of the present disclosure. It will be understood by those of ordinary skill in the art that these may be practiced without independently some of these specific details. In other instances, well-known methods, procedures, components and structures may not have been described in detail so as not to obscure the embodiments.

The following descriptions of preferred embodiments are merely exemplary in nature and are in no way intended to limit the disclosure, its application, or uses. Also, it is to be understood that the phraseology and terminology employed herein are for the purpose of description only and should not be regarded as limiting. It is appreciated that certain features, are, for clarity, described in the context of separate embodiments but may also be provided in combination in a single embodiment. Conversely, various features are, for brevity, described in the context of a single embodiment but may also be provided separately or in any suitable subcombination.

No element, act, or instruction used herein should be construed as critical or essential unless explicitly described as such. As used herein, the articles "a" and "an" are intended to include one or more items, and may be used interchangeably with "one or more." Further, the phrase "based on" is intended to mean "based, at least in part, on" unless explicitly stated otherwise. It will be further understood that the terms "comprise", "have", "include", and "contain", and any forms of these terms, are open-ended linking verbs. As a result, a method or device that "comprises," "has," "includes," or "contains" one or more steps or elements possesses those one or more steps or elements, but is not limited to possessing only those one or more steps or elements. Furthermore, a device or wafer structure that is described configured in a certain way is configured in at least that way, but may also be configured in ways that are not shown.

For purposes of the description hereinafter, the terms "upper", "lower", "top", "bottom", "vertical", "horizontal", "front side", "back side" and derivatives thereof shall relate to the disclosed structures and methods, as oriented in the drawing figures. The terms "on top", "adjacent", "positioned on" or "positioned atop" mean that a first element, such as a first device structure or layer, is present on or in proximity to a second element, such as a second device structure or layer, wherein intervening elements, such as an interface structure or layer may be present, and does not necessarily mean, for example, that a first wafer layer and a second wafer layer are directly contacting one another without any intermediary conducting, insulating or semiconductor layers at the interface of the two layers.

Semiconductor elements, such as a ball grid array (BGA), can be used as part of aerospace sensor architectures and/or other semiconductor architectures. In the photonics domain, III-V materials based on indium phosphide (InP) and gallium arsenide (GaAs) have been a key enabler due to the excellent photonic properties associated with the direct band gap of these materials. In most instances, each of the semiconductor elements is soldered to a primary circuit board (e.g., motherboard, array, etc.) creating the semiconductor array. As used herein, the term "die" refers to a small piece of semiconductor material that has been fabricated with an IC, including but not limited to CMOS, optoelectronics, infrared detectors, MEMS, and the like, and the term "wafer" is used to refer to a thin slice of semiconductor material that may comprise substrate layers and/or be used in the fabrication of ICs. Wafers are typically configured round, but may be any size or shape that is compatible with oxide bond processing, including but not limited to rectangular panel sizes or diced shapes and sizes. The terms "bump" and "bumping" refer to a semiconductor packaging technique that attaches solder balls to bond pads of a wafer or die (e.g., at a TSV connector pad), forming a point of connection to other devices and/or wafers in a wafer stack or assembly. The bond pads may be oxide bonded to a supportive wafer, such as through DBH bonding, electroless nickel immersion gold under bump metallization, etc. For purposes of clarity only, the term "semiconductor wafer assembly" refers to a composite structure of multiple semiconductor wafers and at least one die encapsulated therein that results from fabrication according to any of the embodiments of the currently disclosed methods, while the term "wafer stack" is used to refer to a wafer and die structure at any intermediate stage of the fabrication of the semiconductor wafer assembly.

In most D2W applications, electronic components are built on two semiconductor wafers. One wafer is diced, and the singulated die are aligned and connected (e.g., by bonding, wire interconnections, etc.) onto die sites of the second wafer. As in W2W methods, thinning and TSV interconnection creation are performed in D2W applications either before or after bonding.

Figure 1:
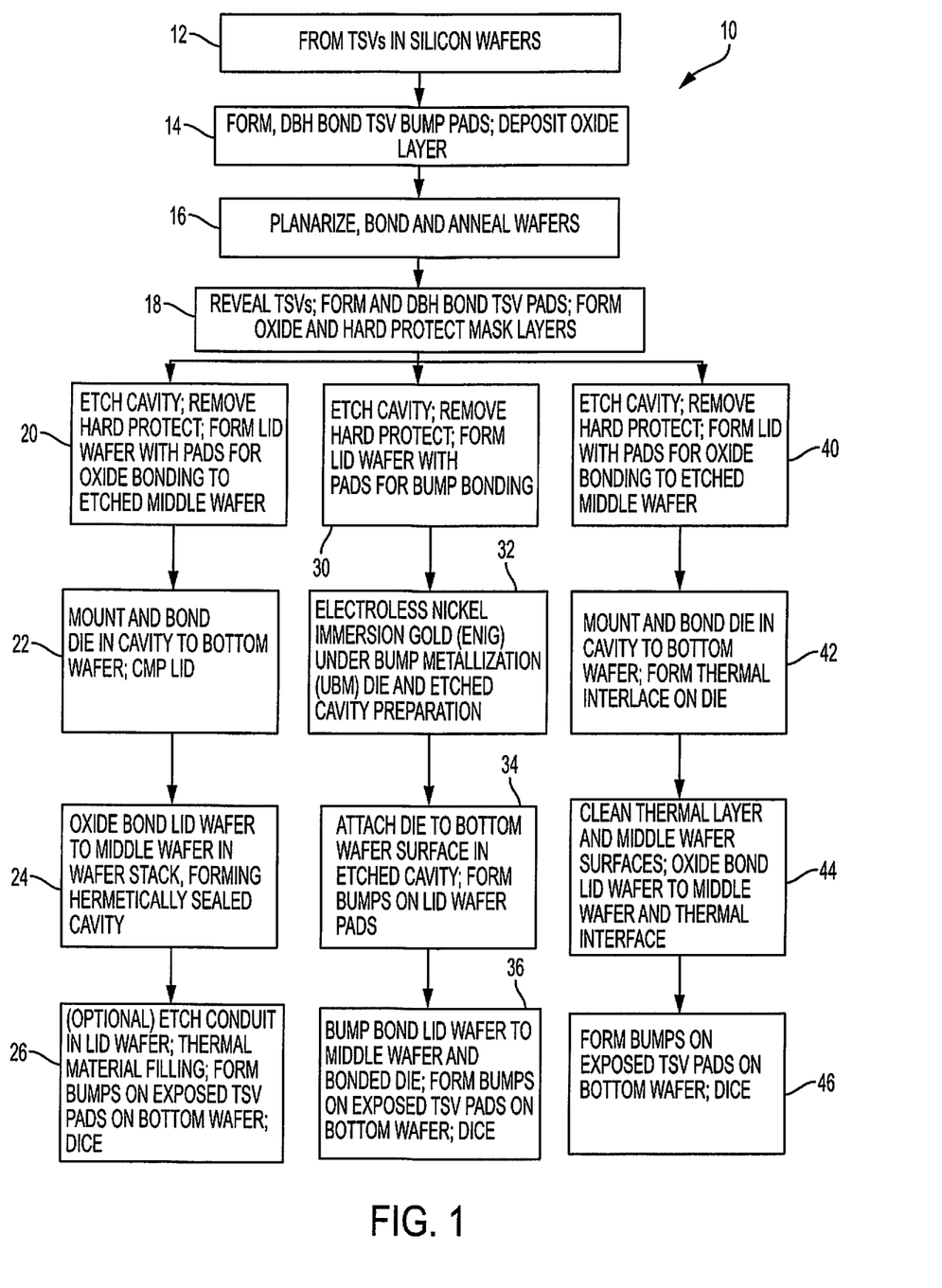
FIG. 1 is a flowchart of three alternative methods for encapsulating one or more device die in an oxide bonded 3D-IC wafer stack, according to illustrative embodiments.

Referring to FIG. 1, a flowchart illustrates a method 10 (having multiple alternative embodiments) for forming a semiconductor wafer assembly in which a device die is encapsulated within three semiconductor wafers, each of which may include an IC. The individual steps of embodiments of method 10 are described in detail with reference to FIGS. 2A-2H, 3A-3D and 4A-4D hereinafter. The embodiments include steps not shown for conventionally creating circuitry (e.g., traces, components, electrical vias) on one or more of semiconductor wafers to be used in manufacturing wafer assemblies. The embodiments of method 10 begin with common initial step 12 (forming corresponding TSV in opposed faces of two silicon wafers), step 14 (forming and direct bond hybridization (DBH) oxide bonding TSV bump pads onto the wafers and depositing an oxide layer on the opposed faces), step 16 (planarizing and bonding the wafers), and 18 (revealing the TSV, forming and DBH oxide bonding TSV pads, depositing and planarizing an oxide layer on a top surface of the wafer stack, and then a hard protect mask in preparation for etching the top surface). The embodiments of method 10 then diverge slightly to accommodate varying connection options between the wafers and the encapsulated die of the finished wafer assembly. Each embodiment includes a step (e.g., steps 20, 30, 40 respectively) for etching one or more cavities into the wafer stack, removing the hard protect mask, and preparing variants of a third wafer to be used as a cavity-sealing lid.

Distinct configurations of the finish semiconductor wafer assembly are achieved through the varying final steps of three exemplary embodiments of method 10. In a first embodiment, step 22 (mounting and bonding die, lid wafer polishing), step 24 (lid wafer bonding) and optional step 26 (conduit etch, thermal filling; dicing) form the wafer assembly such that one or more die bump bonded to the bottom wafer are hermetically sealed in an etched cavity. In a second embodiment, step 32 (die and cavity preparation), step 34 (die attachment and lid wafer bumping) and step 36 (lid wafer attaching, bottom wafer TSV bumping, dicing) form the wafer assembly such that a lid wafer encapsulates and is bump bonded to the mounted die, as well as the middle wafer. A third embodiment of method 10 is similar to the first embodiment, except that steps 42 (die mounting and bonding, thermal interface forming), 44 (cleaning, oxide bonding lid wafer) and 46 (bottom wafer TSV bumping, dicing) result in an oxide bond between the lid wafer and a thermal interface bonded to the encapsulated die. While the optional etching of a conduit (or vent) and underfilling with a thermal material is shown only in step 26, it is understood that such operations could be employed in any of the embodiments.

FIGS. 2A-2H, 3A-3D and 4A-4D schematically show wafer structures corresponding to successive individual process steps of embodiments of method 10. With reference to the schematic cross sectional illustration of a first embodiment of a semiconductor wafer assembly 100 shown in FIG. 2A, disclosed herein are techniques that enable wafer (or substrate) bonded 3D-IC integration in a device package that uses oxide bonding of one or more semiconductor wafers (e.g., bottom wafer 102, middle wafer 104 and lid wafer 106) to enclose, hermetically if so desired, a die 108 within a sealed volume, such as cavity 110 that has been etched into one or more of the wafers 102, 104, 106. The techniques allow incorporation of device die types in a format appropriate for wafer scale 3D-IC integration that may not be accommodated by conventional processing. The die 108 is typically formed of a semiconductor material such as silicon, though it is foreseeable that other materials could be used. Mechanical and electrical integration of the die 108 to bottom wafer 102 and optionally lid wafer 106 can be performed through DBH bonding or by using bump bonding at bumps 112 and pads 114. In other embodiments, the die 108 may be mechanically and electrically connected by wire or similar interconnection and/or by an oxide or an ultrasonic bond.

Figure 2A:
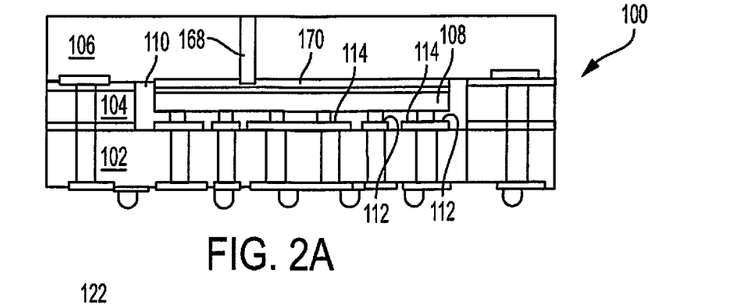
FIGS. 2A-2F are schematic cross-sectional illustrations of unassembled and partially assembled components of a 3D-IC wafer stack.
Figure 2B:
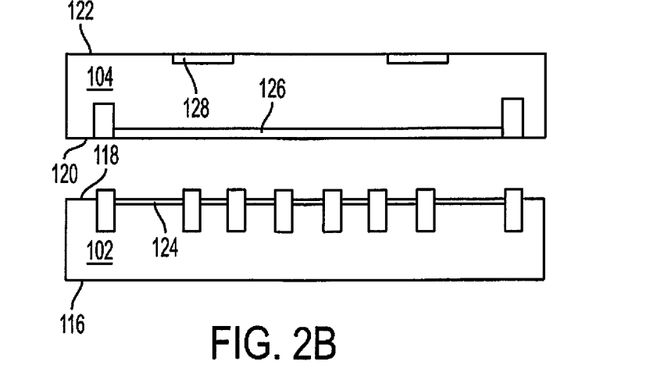

FIG. 2B is a schematic cross-sectional illustration (that corresponds to step 12 of method 10), of unassembled bottom wafer 102 and middle wafer 104 used in front end processing of wafer assembly 100. Middle wafer 104 may be comprised of silicon or other etchable material, while the bottom wafer 102 and top wafer 106 may by comprised of silicon or a different material, such as silicon carbide, fused silica, glass, sapphire, gallium arsenide, indium phosphide, silicon on insulator (SOI), metals, ceramics and other dielectric, conductive, or semiconductor materials. In this embodiment, the wafers 102, 104 may comprise semiconductor wafers, such as silicon semiconductor wafers, however other types of materials could be used. The wafers 102, 104 are generally planar. Bottom wafer 102 includes a bottom surface 116 and a cavity-facing top surface 118, and middle wafer 104 includes a cavity-facing bottom surface 120 and a top surface 122. Bottom wafer 102 may include an IC 124 disposed on or just below cavity-facing surface 11. Middle wafer 104 may also have ICs 126, 128 placed on or just below either or both of cavity-facing bottom surface 120 and top surface 122.

A plurality of TSVs 130a, 130b, etc. (generally 130) may be formed in each of wafers 102, 104 and filled with electrically conductive materials (copper, aluminum, tungsten, doped polysilicon, etc.). TSVs 130 are selectively arranged to provide a plurality of electrical interconnections that allow the wafers 102, 104 to transmit electrical signals, e.g., to electrical components within a given wafer and/or between the device die 108 (of FIG. 2A). TSVs 130 can be formed using a variety of semiconductor processing methods. For example, in some embodiments, a series of photolithographic and chemical processes are performed to remove material from the wafers 102, 104 to produce the vias 130. In some embodiments, an additive process is used to add additional material to the wafers 102, 104 to produce the TSVs 130.

Figure 2C:
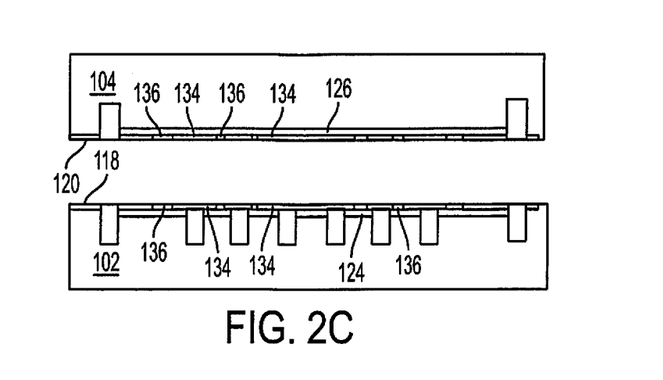
Figure 2D:
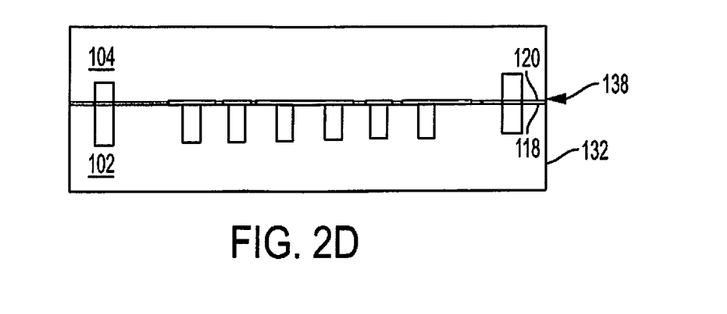

With reference to FIG. 2C (which corresponds to step 14 of method 10), abutting surfaces 118, 120 of bottom wafer 102 and middle wafer 104 are processed to prepare the wafers for bonding to create an intermediate wafer stack 132 (shown in FIG. 2D). In this embodiment, the surfaces 118, 120 are processed to add one or more bump pads 134 for future interconnecting with the device die 102 (shown in FIG. 1A). Oxide layers 136, 138 may then be formed on the opposing surfaces 118, 120 of the wafers 102, 104. Silicon dioxide is formed on a silicon wafer surface when silicon is exposed to oxygen (or a fluid that includes oxygen, e.g., air). A thin layer (e.g., 10 Å) of oxide can be formed on the surfaces 118, 120 when silicon is exposed to air under ambient conditions. Various semiconductor processing technologies are used to create silicon dioxide on silicon surfaces. These technologies typically involve processing the silicon wafer using higher temperatures and different environments (e.g., fluid) to controllably grow layers of silicon dioxide on silicon. For example, temperatures in excess of 600° C. are often used in O2 or H2O environments. However, 350° C. is often the limit for active silicon wafers, in order to avoid degrading performance of the wafer. The formed oxide layer on each surface 118, 120 may then be polished to produce smooth oxide layer surfaces 136, 138 that are co-planar with the bump pads 134. Various techniques can be used to create the smooth surfaces. For example, chemical or mechanical planarization of wafer surfaces 118, 120 can be accomplished to produce smooth surfaces by polishing, etching, or a combination of the two. In some embodiments, the surfaces 118, 120 of the wafers 102, 104 may be smoothed by exposing the wafers to an abrasive and/or corrosive chemical in conjunction with a polishing pad that is in contact with the wafer surfaces 118, 120 and is moved relative to the wafer surfaces. In some embodiments, the surfaces 118, 120 are smoothed to a surface roughness of less than 10 Angstroms.

The wafers 102, 104 may then be bonded together to form wafer stack 132 as shown in FIG. 2D (corresponding to step 16 of method 10), which depicts a cross-sectional view of wafer stack 132. The wafers 102, 104 may be oxide bonded together by DBH and annealed by bringing their planarized oxide surfaces 118, 120 into contact with each other to create a covalent bondline 139 between the wafers 112, 114. The covalent bondline 139 is generally thinner and has less thermal resistance than organic adhesive bonds currently used to join wafers together in a conventional wafer assembly. Because the covalent bondline 139 is relatively thin (e.g., thinner than solder bumps and underfill), interconnects can be placed on the wafers 102, 104 with much higher spacing density.

Figure 2E:
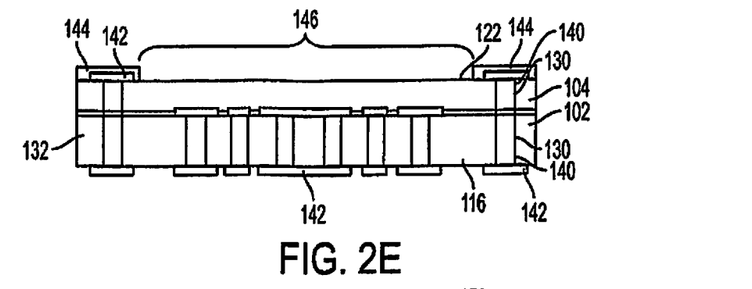

With reference to FIG. 2E (which corresponds to step 18 of method 10), the exposed bottom surface 116 of bottom wafer 102 and top surface 122 of top wafer 104 of wafer stack 132 may then be thinned and planarized to reveal ends 140 of TSVs 130, and interconnect pads 142 may be oxide bonded onto surfaces 116, 122 at the revealed TSVs ends 140. An oxide layer (not shown) may then be selectively added and planarized, and a hard mask 144 formed over regions of wafer surface 122 to be protected from a subsequent etching process.

Figure 2F:
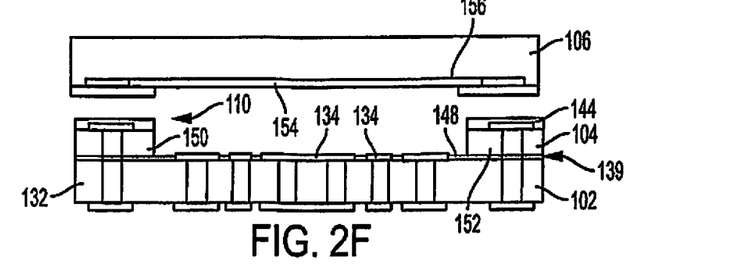

With reference to FIG. 2F (which corresponds to step 20 of method 10), cavity 110 may then be formed in the wafer stack 132 through etching of region 146 of top surface 122 of middle wafer 104 unprotected by the hard protection mask 144 (each shown in FIG. 2E). Use of hard protection mask 144 (e.g., comprised of a TiW alloy) permits a much wider processing temperature range, enabling the device die (not shown) to be mounted in the cavity 110 using a wide range of techniques. Cavity 110 may be etched into the middle wafer 104 down to a buried oxide (BOX) layer 148 at oxide bondline 139 previously formed (step 16) between bottom wafer 102 and middle wafer 104. The BOX layer 148 serves as an etch stop for the cavity etch process, revealing the bump pads 134 for connecting to device die 108 (shown in FIG. 2G) that were previously formed (step 14) on the surfaces of the wafers 102, 104. An outer perimeter of the cavity 110 may be defined by the intersection of the substantially planar BOX layer 148 with substantially vertical sidewalls 150, 152 of the cavity 110 (and to be further defined by bottom surface 154 of to-be-added lid wafer 106). Cavity 110 may be etched with dimensions based upon the number and size of dies to be encapsulated and upon thermal management design requirements, utilizing a silicon etching method, preferably deep reactive ion etch (DRIE), producing nearly vertical sidewalls orthogonal to the BOX layer 148. Alternatively, cavity 110 may be etched using a reactive ion etch (RIE) or an anisotropic chemical etch (which may result in inclined or sloped sidewalls.) The functions of cavity 110 include providing device die 108 environmental protection, high density circuit interconnections, physical packaging and thermal interfaces, as well as to obscure device functionality and provide device security from reverse engineering. Bottom surface 154 of lid wafer 106 (which may include a down-facing IC 156) may contemporaneously be prepared for oxide bonding through oxide layer forming and planarization.

Figure 2G:
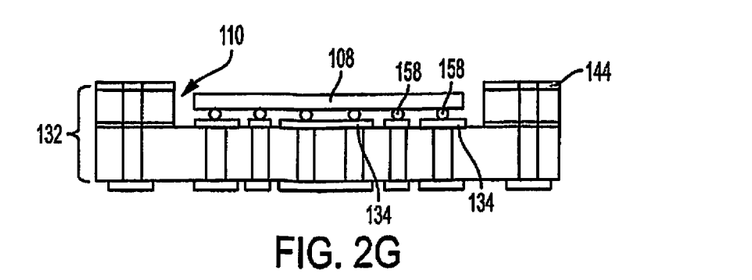
FIGS. 2G and 2H are schematic cross-section illustrations of 3D-IC semiconductor wafer assemblies according to certain embodiments.

With reference to FIG. 2G (which corresponds to step 22 of method 10), one or more homogeneous or heterogeneous device die 108 may then be mechanically and electrically connected to bump pads 134 exposed in cavity 110 via bumps 158. The die mounting process may comprise a variety of techniques, including ultrasonic bonding, solder bumping (e.g., via bump bonds 134), or oxide bonding, Wirebond, epoxy, and may include electrical, mechanical, or thermal interfaces in multiple configurations on any of the surfaces between the die and wafer 102, 104 to which the diet is bonded. Table One presents example transient liquid phase solder bump technologies that could be utilized for mounting device die 108.

TABLE ONE

| Material System | Process Time and Temp. | Re-melt Temp |
|---|---|---|
| Cu—In | 4 min at 180 C. | >307 C. |
| Cu—Sn | 4 min at 280 C. | >415 C. |
| Ag—Sn | 60 min at 250 C. | >600 C. |
| Ag—In | 120 min at 175 C. | >880 C. |
| Au—Sn | 15 min at 260 C. | >278 C. |
| Au—In | 0.5 min at 200 C. | >495 C. |
| Ni—Sn | 6 min at 300 C. | >400 C. |

Figure 2H:
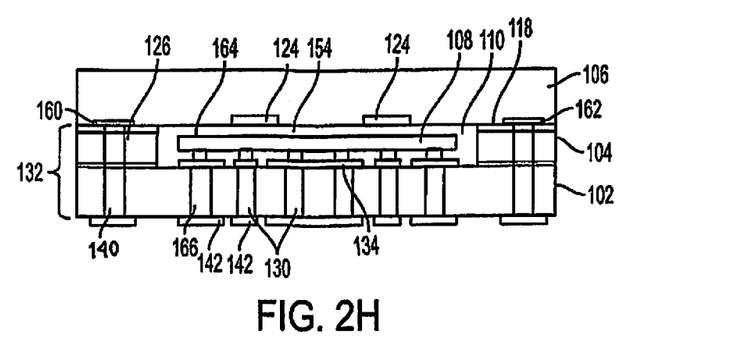

With reference to FIG. 2H (which corresponds to step 24 of method 10), after the die 108 is mounted to bump pads 134 in the cavity 110, the hard mask layer 144 (shown in FIG. 2G) may be removed, allowing the lid wafer 106 to be mounted to the wafer stack 132. In the embodiment shown, cavity 110 is thereby enclosing with extremely robust oxide bonds at wafer interfaces 160, 162 between the remaining portion of top surface 118 of middle wafer 104 and bottom surface 154 of lid wafer 106. Optionally, a thermal material layer 164 may be formed on the die 108, providing a thermal interface between die 108 and lid wafer 106. Additionally, or alternatively, similar thermal interfaces (not shown) may be formed between the die 108 and one or more of the other wafers 102, 104 and/or other die in order to assist in thermally managing the 3D-IC wafer assembly 100. Lid wafer 106 may be oxide bonded at interfaces 160, 162 to form a complete semiconductor wafer assembly 100. In some embodiments, the lid wafer 106 may comprise an external layer of a wafer-on-wafer stack resulting from a completely independent semiconductor fabrication process. The revealed ends 140 of TSVs 130 in, and the interconnect pads 142 formed on bottom surface 116 of bottom wafer 102 may provide electrical paths for connection(s) between the die 108 and wafers 102, 104, 106 to external devices and wafers (not shown). In other embodiments, the remaining portion of top surface 118 of middle wafer 104 and bottom surface 154 of lid wafer 106 may be bonded at the interfaces 162, 164 using a solder or a thermocompressive bond. As noted, the bonding process may seal cavity 110 at the interfaces 160, 162 so as to form a hermetic seal encapsulating the device die 108.

The top surface 118 and bottom surface 154 can be bonded at the interfaces 160, 162 in the absence of any external pressure. However, in some embodiments such as thermocompressive bonding, additional pressure is applied to force the surfaces 118, 154 into contact with each other. The die 108 may be interconnected through metal features (e.g., bump pads, vias, etc.) or circuity exposed within the cavity 110 to any or all of the wafers 102, 104, 106 in the 3D wafer assembly 100, each of which may contain one or more electrically conductive ICs 124, 126, including active or passive ICs, which can be either planar on any surface, or vertically arranged through the wafer.

With reference again to FIG. 2A (some features of which correspond to processing step 26), a hole or conduit 168 may be etched through any or all of the wafers 102, 104, 106, for example, so as to allow ingress of a thermal or structural material to make contact with the encapsulated die 108. Alternatively, this conduit 168 could be used to purge or backfill the cavity 110 with a desired gas or liquid to enhance certain properties of the embedded ICs. A thermally conductive material 170 (e.g., a non-conductive cooling fluid, or any number of materials used for thermal, electrical, chemical, protective functions, or mechanical purposes) may fill a portion or all of the cavity 110 and then the conduit 168 may be plugged (e.g., with solder, etc.) or filled with the thermally conductive material 170. Alternatively, the conduit 168 may serve as a thermal vent to and from cavity 110. The completed first embodiment of the 3D-IC wafer assembly 100 may then be diced by conventional means.

Those of skill in the art will appreciate the advantages that the disclosed techniques provide, including the ability to manage D2W yield losses independently from W2W processes that form wafer stacks that may be bonded to the 3D-IC wafer assemblies 100 such as described above. The yield of devices resulting from the processes disclosed herein is improved by incorporating only "known-good die" into the devices and thereby avoiding stacking yield loss, which decreases the overall costs. Furthermore, the ability to bond thin dies allows for the stacking of multiple device layers, including those from different technologies, connected vertically utilizing TSVs while maintaining a low-profile package and short electrical path lengths. Different device dies often have distinct thicknesses (e.g., 100 μm-700 μm). In order to accommodate dissimilar die thicknesses in multiple die encapsulation wafer assembly embodiments, middle wafer 104 can be fabricated to have a thickness (and thus, cavity depth) greater than that of the thickest interconnected die 108, in order to eliminate the need to closely match III-V device thicknesses, and also to provides thermal isolation. In addition, blind frontside via processes may be employed for wafers connecting to the D2W assemblies 100 in order to contain costs, and permits back-off positions for solder burn processing for die mounting and external wafer connections. Conventional organic bonds used in underfilling attachment of individual dies together is performed after individual chips/dies have been excised from an array; whereas the technology described herein permits the bonding to be performed at the wafer level. In some embodiments, the covalent bondlines may be 10 times thinner than an organic bondline.

Figure 3A:
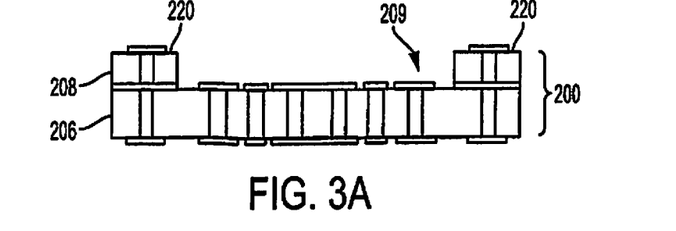
FIGS. 3A-3C are schematic cross-sectional illustrations of partially assembled components of a 3D-IC wafer stack.
Figure 3B:
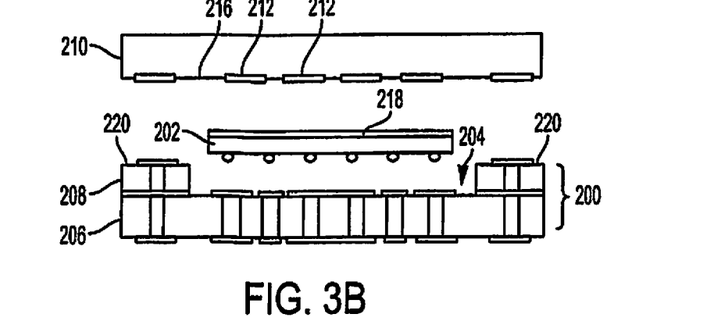
Figure 3C:
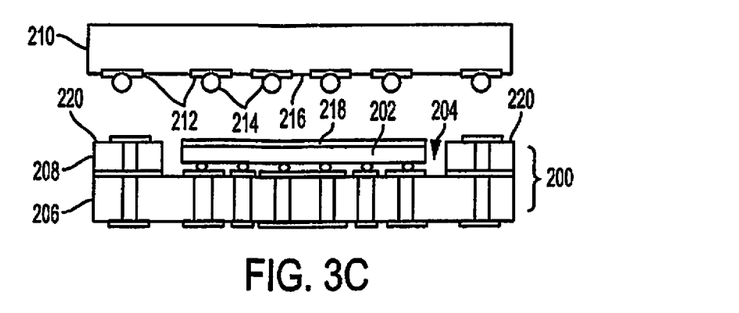
Figure 3D:
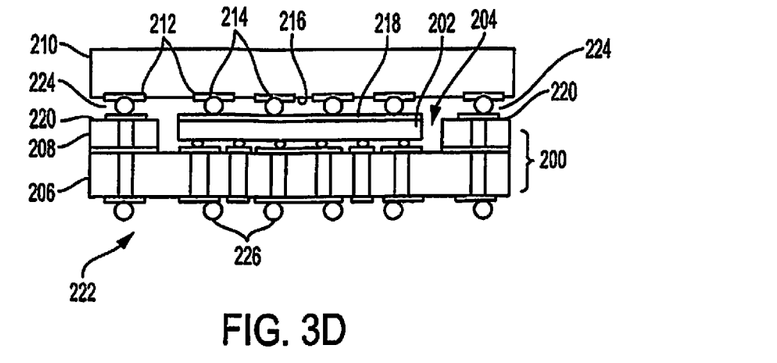
FIG. 3D is a schematic cross-section illustration of a 3D-IC wafer assembly, according to certain embodiments.

FIGS. 3A-3D are schematic cross-sectional illustrations of exploded and integrated views of a wafer stack 200 undergoing processing according to a second method embodiment (corresponding to steps 30-36 of method 10) to fabricated an alternative embodiment of an oxide bonded wafer assembly encapsulating a device die 202 in a cavity 204 formed by a bottom wafer 206, middle wafer 208 and lid wafer 210. The front end semiconductor processes employed in fabricating this alternative wafer assembly may be identical to those described in association with FIGS. 2A-2D of the first method embodiment. The wafer processing results depicted in FIGS. 3A-3D have some similarities (e.g., general semiconductor processing techniques, orientations and compositions of the wafer, etc.), but differ in several aspects from those shown in FIGS. 2E-2H. FIG. 3A illustrates wafer stack 200 comprised of bottom wafer 206 and middle wafer 208, into which one or more cavity 204 has been etched. As shown in FIGS. 3B-3D, different back end processes may be utilized in this second embodiment to form bump pads 212 and bumps 214 (which may be thermal bumps where connected to die 202) on a bottom surface 216 of lid wafer 210. The lid wafer 210 is bump bonded to a back side 218 of mounted die 202 and to middle wafer 208 at connection points 220. Bump bonding the lid wafer 210 to the middle wafer 208 (as opposed to the oxide bonding of the first method embodiment) results in a 3D-IC semiconductor wafer assembly 222 such as depicted in FIG. 3D, in which the middle wafer 208 and the lid wafer 210 define an air gap 224, rather than encapsulating the device die 202 in a hermetically sealed cavity. Lid wafer 210 may be electrically and mechanically coupled to middle wafer 208 through solder ball bonds 224 which, for example, enables electrical signals to be passed among the wafers 206, 208, 210 and die 202 in the wafer assembly 222. Once the lid wafer 210 is bonded, the completed, electrical connections 226 may be added to the wafer assembly 222 for connecting to external devices, wafers, etc., and the wafer assembly may be further processed and/or diced.

Figure 4A:
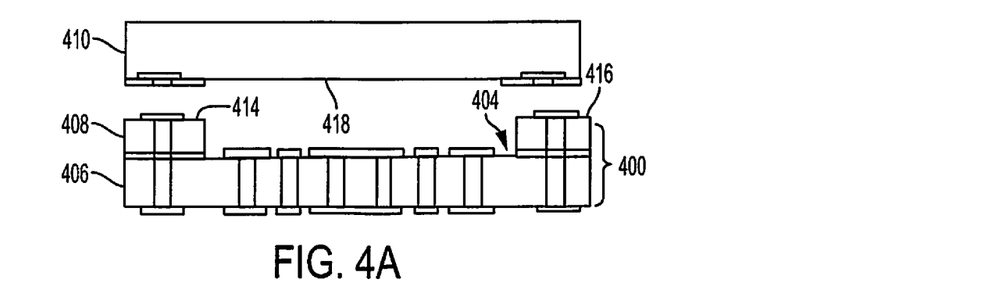
FIGS. 4A-4C are schematic cross-sectional illustrations of partially assembled components of a 3D-IC wafer stack.
Figure 4B:
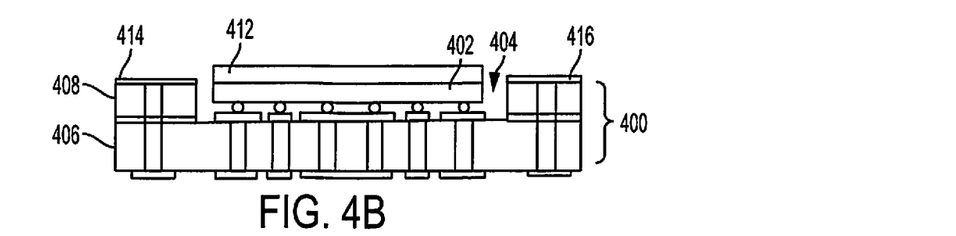
Figure 4C:
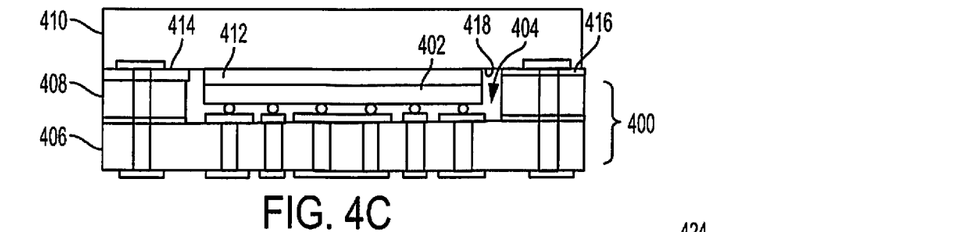
Figure 4D:
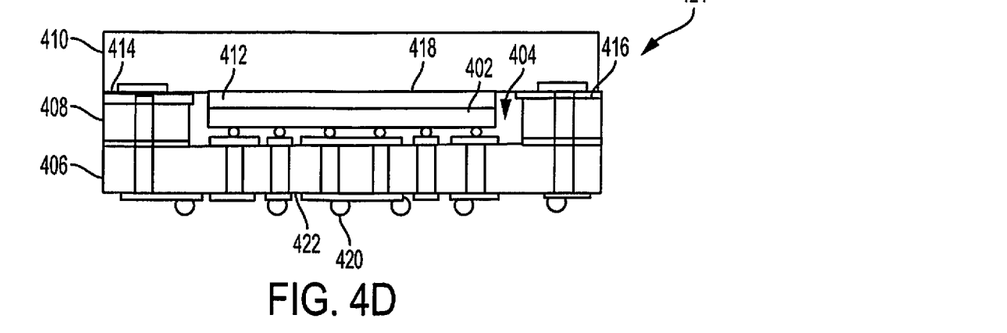
FIG. 4D is a schematic cross-section illustration of a 3D-IC wafer assembly, according to certain embodiments.

FIGS. 4A-4D are schematic cross-sectional illustrations of exploded and integrated views of a wafer stack 400 undergoing processing according to a third method embodiment (corresponding to steps 40-46 of method 10) to fabricated an alternative embodiment of an oxide bonded wafer assembly encapsulating a device die 402 in an enclosed cavity 404 defined by a bottom wafer 406, middle wafer 408 and lid wafer 410. The front end semiconductor processes employed in fabricating this alternative wafer assembly may be identical to those described in association with FIGS. 2A-2D of the first method embodiment. The wafer processing results depicted in FIGS. 4A-4D have some similarities (e.g., general semiconductor processing techniques, orientations and compositions of the wafer, etc.), but differ in several aspects from those shown in FIGS. 2E-2H. One variation from the first embodiment is shown in FIG. 4B, wherein a thermal interface layer 412 (or other functional layer such as described above) may be formed on the device die 402 either before or after attaching the die 402 in the cavity 404. The thermal interface layer 412 may then be planarized, cleaned and oxide bonded in a manner similar to that described above, as may contemporaneously be an opposing bottom surface 418 of lid wafer 410. Electrical bumps 420 for external connection to other wafers (not shown) may be added to surface 422 of bottom wafer 406, as shown in FIG. 4D. Lid wafer 410 may be electrically and mechanically coupled to middle wafer 408 at top surface regions 414, 416 and to thermal layer 412. The bonding between middle layer 406 and lid layer 408 results in a composite 3D-IC wafer assembly 424 having a hermetically sealed cavity 404 encapsulating device die 402. The surfaces 414, 416, 418, may be prepared to be planarized oxide surfaces (similarly as described with respect to, for example, FIGS. 2A-2H) prior to bonding the wafers together.

As various modifications could be made to the exemplary embodiments, as described above with reference to the corresponding illustrations, without departing from the scope of the disclosure, it is intended that all matter contained in the foregoing description and shown in the accompanying drawings shall be interpreted as illustrative rather than limiting. Thus, the breadth and scope of the present disclosure should not be limited by any of the above-described exemplary embodiments, but should be defined only in accordance with the following claims appended hereto and their equivalents.

What is claimed is:

1. A method of encapsulating a die into a semiconductor wafer assembly, the method comprising:
    etching a cavity into an oxide bonded semiconductor wafer stack;
    positioning a semiconductor die in the cavity;

mechanically and electrically mounting the semiconductor die to the wafer stack; and encapsulating the semiconductor die within the cavity by bonding a lid wafer to the wafer stack.

2. The method of claim 1, wherein mechanically and electrically mounting the semiconductor die comprises a process selected from bump bonding, wire interconnecting, ultrasonic bonding, and oxide bonding.

3. The method of claim 1, wherein bonding the lid wafer to the wafer stack further comprises:

creating an oxide layer on a first surface of the wafer stack;

creating an oxide layer on a first surface of the lid wafer; and bonding the oxide layer of the first surface of the wafer stack to the oxide layer of the first surface of the lid wafer to create a wafer assembly and to form a hermetic seal around the cavity.

4. The method of claim 1, further comprising forming a conduit from the exterior of the wafer assembly through the lid wafer to the cavity.

5. The method of claim 4, further comprising delivering a sufficient amount of a thermal material to the conduit to fill the conduit or the conduit and at least a portion of the cavity.

6. The method of claim 1, further comprising forming a thermal material layer on the semiconductor die.

7. The method of claim 1, further comprising dicing the wafer assembly to produce one or more semiconductor chips, each semiconductor chip including one or more encapsulated semiconductor die.

8. The method of claim 1, further comprising evacuating and sealing the conduit and the cavity to provide a vacuum package.

9. The method of claim 1, further comprising evacuating and backfilling the conduit and the cavity with a liquid or gas before sealing.

* * * * *